(12) United States Patent
Dine

(10) Patent No.: US 8,206,604 B2
(45) Date of Patent: Jun. 26, 2012

(54) METHODS AND ARRANGEMENTS FOR MANAGING PLASMA CONFINEMENT

(75) Inventor: Sebastien Dine, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 156 days.

(21) Appl. No.: 12/839,374

(22) Filed: Jul. 19, 2010

(65) Prior Publication Data

US 2010/0279028 A1    Nov. 4, 2010

Related U.S. Application Data

(63) Continuation of application No. 11/618,591, filed on Dec. 29, 2006, now Pat. No. 7,758,718.

(51) Int. Cl.
*H05H 1/02* (2006.01)
*H01L 21/3065* (2006.01)

(52) U.S. Cl. ........ 216/67; 216/71; 427/569; 156/345.35

(58) Field of Classification Search ........................ None
See application file for complete search history.

(56) References Cited

U.S. PATENT DOCUMENTS

| | | |
|---|---|---|
| 4,464,223 A | 8/1984 | Gorin |
| 4,963,242 A | 10/1990 | Sato et al. |
| 5,210,466 A | 5/1993 | Collins et al. |
| 5,231,334 A | 7/1993 | Paranjpe |
| 5,252,178 A | 10/1993 | Moslehi |
| 5,286,297 A | 2/1994 | Moslehi et al. |
| 5,858,162 A | 1/1999 | Kubota |
| 5,932,116 A | 8/1999 | Matsumoto et al. |
| 6,178,919 B1 | 1/2001 | Li et al. |
| 6,383,896 B1 | 5/2002 | Kirimura et al. |
| 6,524,432 B1 | 2/2003 | Collins et al. |
| 6,572,732 B2 | 6/2003 | Collins |
| 6,623,596 B1 | 9/2003 | Collins et al. |
| 6,984,288 B2 | 1/2006 | Dhindsa et al. |
| 7,067,034 B2 | 6/2006 | Bailey, III |
| 7,281,491 B2 | 10/2007 | Iwamaru |

(Continued)

FOREIGN PATENT DOCUMENTS

WO    WO-00/00999 A1    1/2000

OTHER PUBLICATIONS

"U.S. Appl. No. 11/618,591;", filed Dec. 29, 2006.

(Continued)

*Primary Examiner* — Allan Olsen
(74) *Attorney, Agent, or Firm* — IPSG, P.C., Intellectual Property Law

(57) ABSTRACT

A method for confining plasma within a plasma processing chamber while processing a substrate is provided. The method includes igniting the plasma within a plasma generating area, wherein the plasma generating area is surrounded by a set of confinement rings. The method also includes providing a chamber wall outside of the set of confinement rings. The method further includes providing a dielectric liner electrode arrangement positioned between the chamber wall and the set of confinement rings, wherein the dielectric liner electrode arrangement having an electrode encapsulated within a dielectric liner, the dielectric liner electrode arrangement being coupled with the chamber wall to create a modified chamber wall. The method yet also includes providing a parallel LC circuit arrangement, the parallel LC circuit arrangement being coupled between the dielectric liner electrode arrangement and the chamber wall.

20 Claims, 7 Drawing Sheets

U.S. PATENT DOCUMENTS

| | | | |
|---|---|---|---|
| 7,922,880 B1* | 4/2011 | Pradhan et al. | 204/298.06 |
| 2002/0092618 A1 | 7/2002 | Collins | |
| 2008/0142359 A1* | 6/2008 | Gopalraja et al. | 204/298.16 |

OTHER PUBLICATIONS

"Notice of Allowance", Issued in U.S. Appl. No.: 11/618,591; Mailing Date: Mar. 10, 2010.

"Internationai Search Report", Issue in PCT Application No. PCT/US2007/088956; Mailing Date.; Apr. 18, 2008.

"Written Opinion", Issue in PCT Application No. PCT/US2007/088956; Mailing Date.: Apr. 18, 2008.

"International Preliminary Report on Patentability", Issued in PCT Application No. PCT/US2007/088956; Mailing Date: Jul. 9, 2009.

"First Office Action", Chinese Patent Application No. 200780048659.2, Mailing Date: Oct. 13, 2010.

* cited by examiner

//METHODS AND ARRANGEMENTS FOR MANAGING PLASMA CONFINEMENT

PRIORITY CLAIM

This continuation application claims priority under 37 CFR 1.53(b) of and claims the benefit under 35 U.S.C. §120 to a commonly assigned patent application entitled "Reduced Electric Field Arrangement For Managing Plasma Confinement," by Fischer et al., application Ser. No. 11/618,591 filed on Dec. 29, 2006, now U.S. Pat. No. 7,758,718 all of which are incorporated here by reference.

BACKGROUND OF THE INVENTION

Advances in plasma processing have facilitated growth in the semiconductor industry. During plasma processing, plasma may be generated to process a substrate. However, plasma has a tendency to expand beyond the wafer region. Thus, the inability to confine the plasma may result in uncontrollable substrate processing, which may result in substandard devices and/or defective devices.

To facilitate discussion, FIG. 1A shows a schematic of a plasma processing system 100. Plasma processing system 100 may be a single, double (DFC) or triple frequency RF capacitively discharge system. In an example, radio frequencies (RF) may include, but are not limited to, 2, 27 and 60 MHz. Plasma processing system 100 may be configured to include an upper electrode 102, which is generally grounded and has a voltage potential of zero. Also, plasma processing system 100 may include an electrostatic chuck 104, which may act as a lower electrode.

Consider the situation wherein, for example, a substrate 120 is being processed. During plasma processing, an RF power 116 may be applied to electrostatic chuck 104. RF power 116 may interact with a gas 118 to ignite a plasma 106 between electrostatic chuck 104 and grounded upper electrode 102. Plasma 106 may be employed to etch and/or deposit materials onto substrate 120 to create electronic devices.

Plasma 106 tends to expand beyond the wafer region (e.g., outside of the region between upper electrode 102 and electrostatic chuck 104). If plasma expands beyond the wafer region, plasma density may decrease and plasma processing may shift outside of the wafer region resulting in uncontrollable substrate processing. Since plasma 106 is best controlled within the wafer region, manufacturers have attempted to confine the plasma. In an example, Lam Research Corporation has attempted to perform plasma confinement by mechanically confining the plasma by employing confinement rings.

Plasma processing system 100 shows a plurality of confinement rings (112a, 112b, 112c, 112d, and 112e), which may be a set of parallel rings inside the processing chamber to prevent the plasma from forming in the outer region. As discussed herein, outer region refers to the area between the confinement rings and a reactor wall. Typically, confinement rings may be constructed of dielectric material such as quartz.

However, confinement rings may not be sufficient to confine plasma if the electric field is high enough to interact with gas 118 to ignite a plasma in the outer region. In an example, plasma 106 may have a voltage potential ($V_p$), which may be a self-induced potential of the plasma relative to ground. An electric field may be induced due to the differences between the voltage potential of plasma 106 (e.g., at plasma edge 108) and the voltage potential of a reactor wall 114, which is typically grounded and has a voltage potential of zero. Thus, if the difference is high enough, a strong electric field 110 may be created resulting in plasma being ignited in the outer region.

The electric field amplitude induced due to the voltage difference between voltage potential of plasma edge 108 and the voltage potential at reactor wall 114 may be expressed by Equation 1:

$$E \approx \frac{V_p - V_w}{d} = \frac{V_p}{d} \qquad [\text{Equation 1}]$$

In Equation 1, the electric field amplitude (E) may be proportional to the potential difference between voltage potential ($V_p$) at plasma edge 108 and voltage potential ($V_w$) at reactor wall 114. Given that reactor wall may be grounded, the voltage potential ($V_w$) at reactor wall 114 may be equaled to zero. Thus, the electric field amplitude (E) may be equaled to the voltage potential ($V_p$) at plasma edge 108 divided by the distance (d) between plasma edge 108 and reactor wall 114.

As shown in Equation 1, the electric field (E) may be higher if the voltage potential ($V_p$) at plasma edge 108 increase or the distance (d) (i.e., the distance between the plasma edge and the reactor wall) decrease. The increase in electric field may lead to plasma striking in the outer region causing unintended plasma unconfinement.

To be competitive, manufacturers have attempted to increase plasma processing efficiency. In an example, manufacturers may want to increase efficiency in the etching process by increasing the etch rate. To increase the etch rate, higher RF power may be employed to increase the plasma density. However, as can be seen from Equation 1, higher RF power may result in a higher plasma potential (i.e., voltage potential at the plasma edge), which may result in a stronger electric field being generated. Thus, an increased in the RF power may result in an electric field with sufficient amplitude to ignite plasma in the confinement rings region. In another example, manufacturers may want to increase process efficiency and control by employing a higher gas flow rate at a given RF power to increase the etch rate. However, a higher gas flow rate may also increase the gas pressure and thus the likelihood of plasma striking in the outer region. Due to the electric field that may be generated in the outer region, substrate processing may be limited in term of the amount of RF power and/or gas flow rate that may be employed.

In addition, manufacturers may maintain their competitiveness by processing a larger substrate in order to create more devices per processing cycle. However, increasing the substrate size may decrease the distance (d) between plasma edge 108 and reactor wall 114. As can be seen from Equation 1, the reduction in the distance (d) may also give rise to an increase in the electric field (E), thereby, increasing the possibility of plasma ignition in the outer region.

FIG. 1B shows an equivalent circuit model of FIG. 1A. During plasma processing, RF power 116 may be applied to electrostatic chuck 104. Since upper electrode 102 is grounded, a large part of the RF current may return to ground through upper electrode 102. At the edge of the plasma, RF current may return to ground via three different paths. The RF current may return to ground (e.g., reactor walls) by capacitively coupling with an upper electrode extension 182 and a lower electrode extension 180, which is shown as capacitors 21 and 22, respectively. The remaining RF current may return to ground by flowing through the confinement rings, as shown by capacitor 23.

Some manufacturers have attempted to reduce the electric field by reducing the capacitance formed by capacitor 23. Capacitance may be reduced by increasing the distance (d) between plasma edge 108 and reactor wall 114. However, the increase in the distance (d) may require an increase in the reactor size. Increasing the reactor size may also require modifying other tool components. The cost associated with changing the reactor and its component may be costly.

With the prior art plasma confinement arrangement, confinement rings may be able to prevent the plasma from expanding into the outer region. However, as manufacturers attempt to be competitive by increasing process efficiency and control (e.g., increase RF power, increase gas flow rate, and increase substrate size), the confinement rings may no longer be an effective plasma confinement tool as the electric field increases, thereby increasing the potential of plasma being ignited in the outer region. Also, the prior art solution of increasing the reactor size to reduce the electric field may be an expensive alternative and does not provide a solution for current plasma processing system owners.

SUMMARY OF INVENTION

The invention relates, in an embodiment, to a method for processing a substrate in a plasma processing chamber having a chamber wall. The method includes providing an electrode arrangement having a cylindrical electrode encapsulated within a dielectric liner, which is coupled with the chamber wall. The method also includes providing an inductive circuit arrangement, which is coupled between the cylindrical electrode and the chamber wall. The method further includes generating a plasma within the plasma processing chamber to process the substrate while the electrode arrangement is disposed within the plasma processing chamber.

The above summary relates to only one of the many embodiments of the invention disclosed herein and is not intended to limit the scope of the invention, which is set forth in the claims herein. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

Figure 1A:
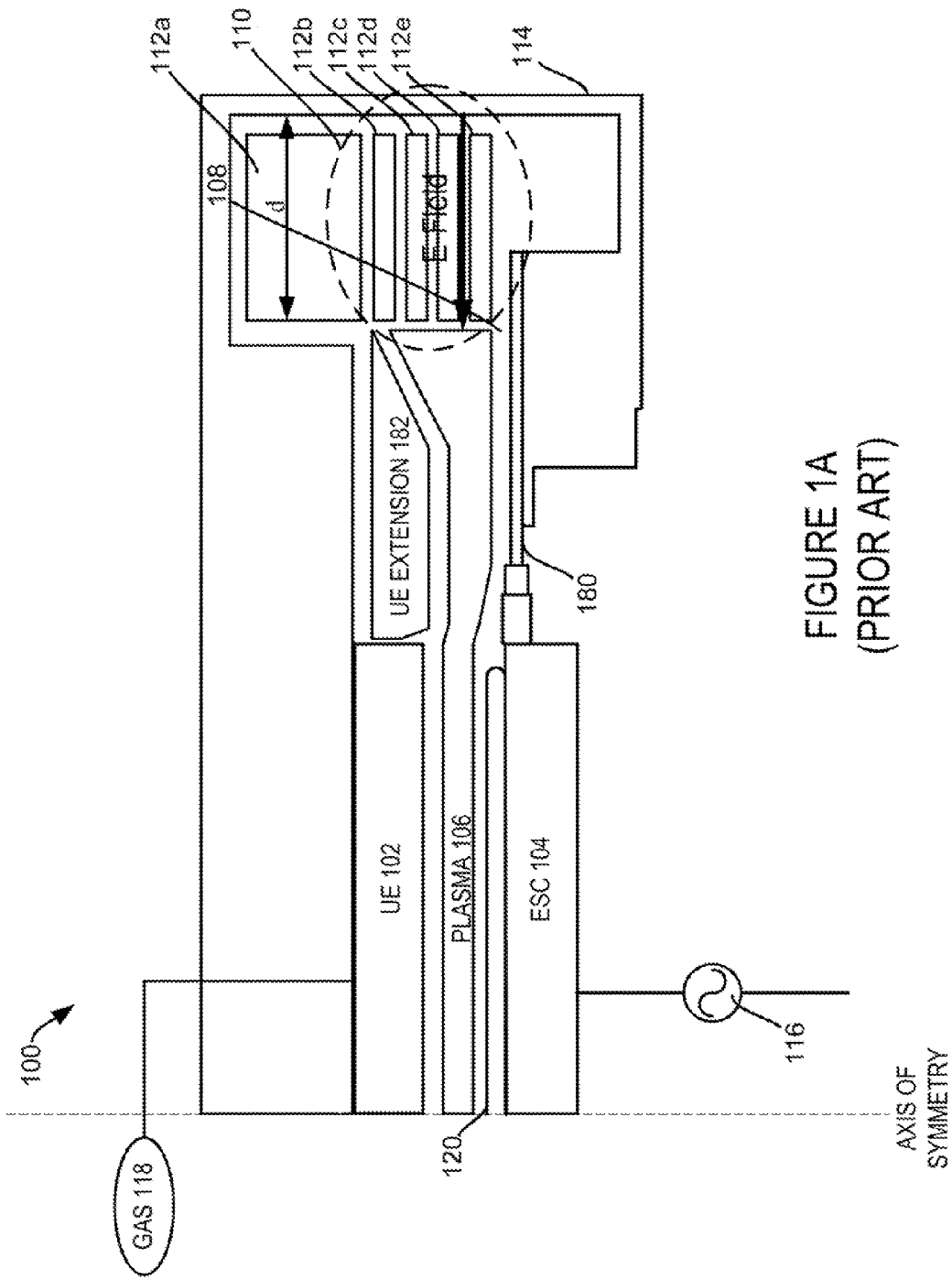
FIG. 1A shows a schematic of a plasma processing system.
Figure 1B:
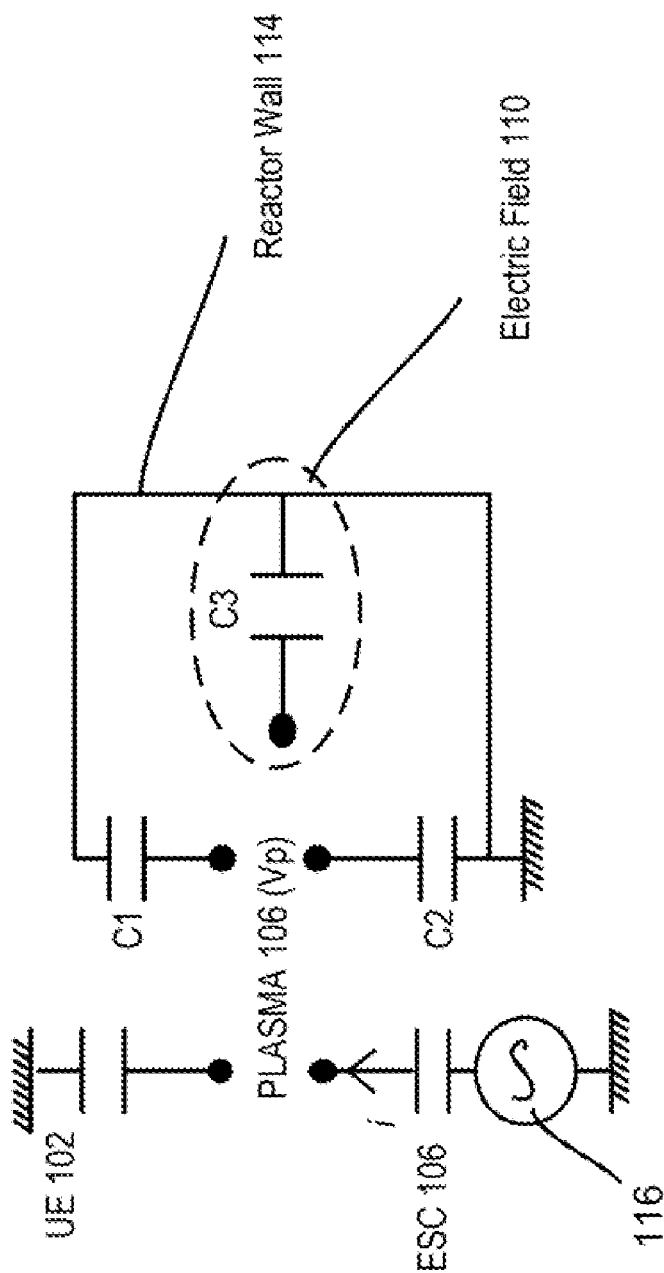
FIG. 1B shows an equivalent circuit model of FIG. 1A.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

In accordance with one aspect of the present invention, the inventor herein realized that a decrease in the electric field may be achieved by decreasing the voltage potential difference in the outer region. Decrease in the voltage potential difference may be achieved by either decreasing the voltage potential of the plasma or by increasing the voltage potential of the reactor wall. Since a decrease in voltage potential of the plasma may decrease efficiency in substrate processing, the voltage potential of the reactor wall may have to be increased in order to decrease the voltage potential difference. Thus, the inventor herein realized that a mechanism may have to be provided in which the capacitance is reduced (or the impedance is increased) in order to increase the voltage potential at the reactor wall region.

In accordance with the embodiments of the invention, a reduced electric field arrangement is provided for confining plasma in a plasma processing chamber. Embodiments of the invention enable a reduced electric field arrangement to include a dielectric liner electrode arrangement. Embodiments of the invention also enable the dielectric liner electrode arrangement to electrically couple with a set of adjustable inductance coils to decrease the electric field.

In an embodiment of the invention, the reduced electric field arrangement may include a modified reactor wall that is modified by attaching a dielectric liner electrode arrangement. The dielectric liner arrangement may include an electrode encapsulated inside a dielectric liner. In an embodiment, the electrode may have a cylindrical shape.

With a dielectric liner electrode arrangement placed between the plasma edge and the reactor wall, the electric field may now be calculated based on the voltage potential difference between the edge of the plasma and the dielectric liner electrode arrangement. In an embodiment, the electric field formed at the outer region may be reduced by introducing an induced voltage ($V_i$) at the electrode. To create an induced voltage ($V_i$) at the electrode, the electrode may be electrically connected to an inductive circuitry.

In an embodiment, the inductive circuitry may include a set of adjustable inductive coils. Adjustments may include adjusting the size of the coils, the number of coil turns, the coil material, the geometry of the coils, and the like. In an embodiment, the set of adjustable inductive coils may include one or more inductive coils in a series. In another embodiment, the set of adjustable inductive coils may include a set of variable inductance coils that may be capable of matching the frequency of the RF power being applied to an electrostatic chuck.

By modifying the reactor wall, the electric field being created in the outer region is now a function of the voltage potential at the plasma edge and the induced voltage potential at the electrode. Since the induced voltage potential at the electrode is a function of the inductance, which is a function of the frequency of the RF power being applied to the electrostatic chuck, the induced voltage potential at the electrode and the voltage potential at the plasma edge may become more similar, thereby reducing the voltage potential difference. As a result, the strength of the electric field may diminish and the possibility of plasma unconfinement may be substantially reduced or eliminated, thereby allowing manufacturers to employ a wider process window and process a larger substrate during plasma processing.

The features and advantages of the invention may be better understood with reference to the figures and discussions that follow.

Figure 2A:
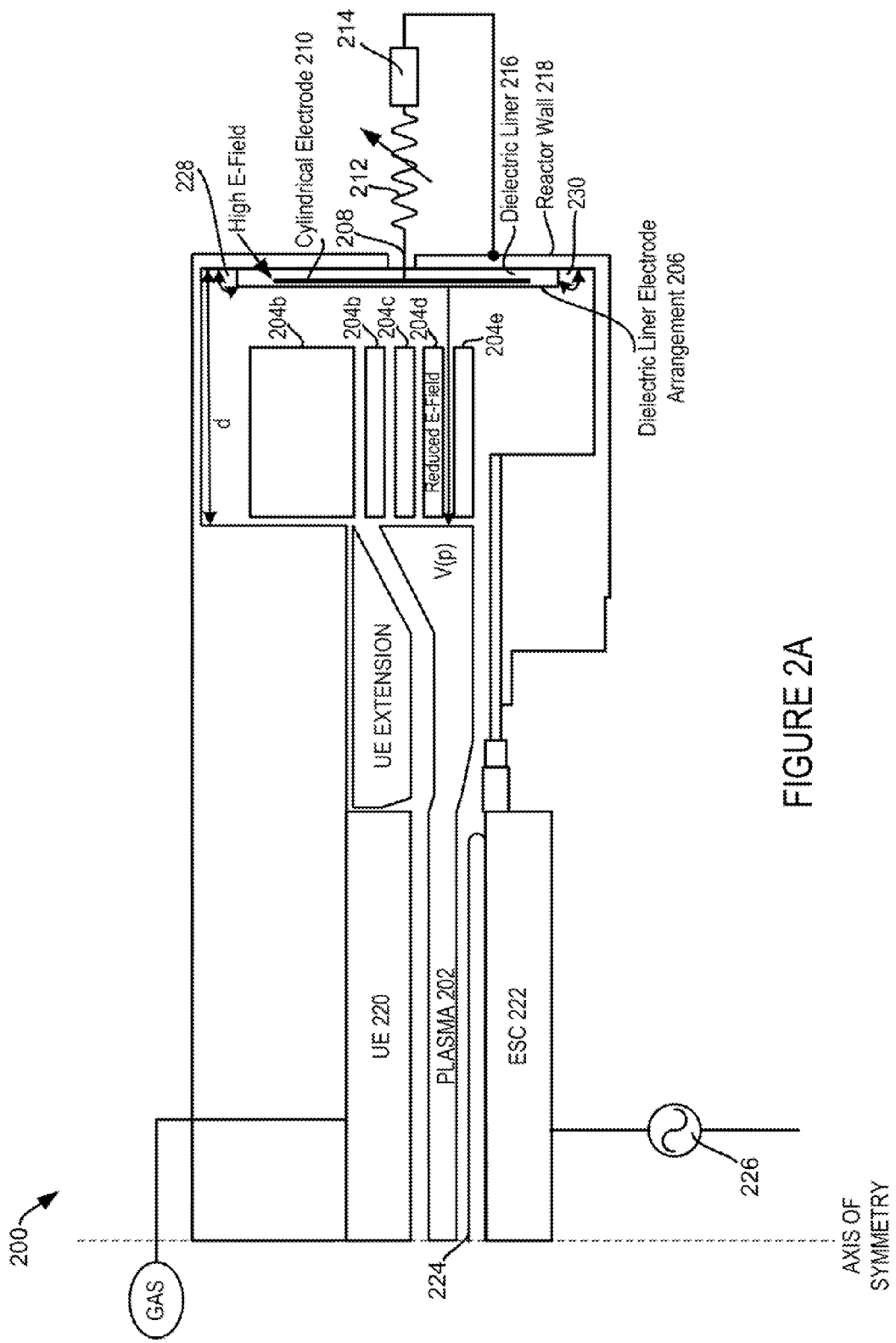
FIG. 2A shows, in an embodiment of the invention, a simple cross-sectional diagram of an implementation of a dielectric liner electrode arrangement coupled with an inductive circuitry.

FIG. 2A shows, in an embodiment of the invention, a simple cross-sectional diagram of an implementation of a dielectric liner electrode arrangement coupled with an inductive circuitry. A plasma processing system 200 may be configured to include an upper electrode 220, which is generally grounded and has a voltage potential of zero. Also, plasma processing system 200 may include an electrostatic chuck 222, which may act as a lower electrode.

Consider the situation wherein, for example, a substrate 224, which may be a silicon wafer, is being processed. During plasma processing, an RF power 226 may be applied to electrostatic chuck 222. RF power 226 may interact with a gas to ignite a plasma 202 between electrostatic chuck 222 and grounded upper electrode 220. Plasma 202 may be employed to etch and/or deposit materials onto substrate 224 to create electronic devices. During plasma processing, plasma 202 with a voltage potential ($V_p$) may be confined by a set of dielectric confinement rings (204a, 204b, 204c, 204d, and 204e). As aforementioned, plasma 202 tends to expand beyond the wafer region (e.g., outside of the region between upper electrode 220 and electrostatic chuck 222) as the gas interacts with the electric field in the outer region.

To prevent the likelihood of plasma unconfinement, a reduced electric field arrangement is provided. The reduced electric field arrangement may include a modified reactor wall 218 that is modified by attaching a dielectric liner electrode arrangement 206. In an embodiment, dielectric liner electrode arrangement 206 may be cylindrical. Dielectric liner electrode arrangement 206 may be attached to modified reactor wall 218. In an embodiment, the attachment is a mechanical bond between dielectric liner electrode arrangement 206 and modified reactor wall 218. In another embodiment, dielectric liner electrode arrangement 206 may be attached to modified reactor wall 218 via a set of dielectric fixtures (e.g., dielectric screw).

In an embodiment, dielectric liner electrode arrangement 206 may include a cylindrical electrode 210. In an embodiment, the cylindrical electrode 210 may have a thickness of 1 mm or less. The size of the electrode may be relevant in reducing the space that the electrode may occupy in the reactor chamber. Also, cylindrical electrode 210 may be made of a conductive material such as a material that includes aluminum. Although cylindrical electrode 210 may interact with RF power 226 to create a voltage potential at cylindrical electrode 210, the impedance may be relatively low and the voltage potential created may not be sufficient to significantly reduce the electric field.

Figure 2B:
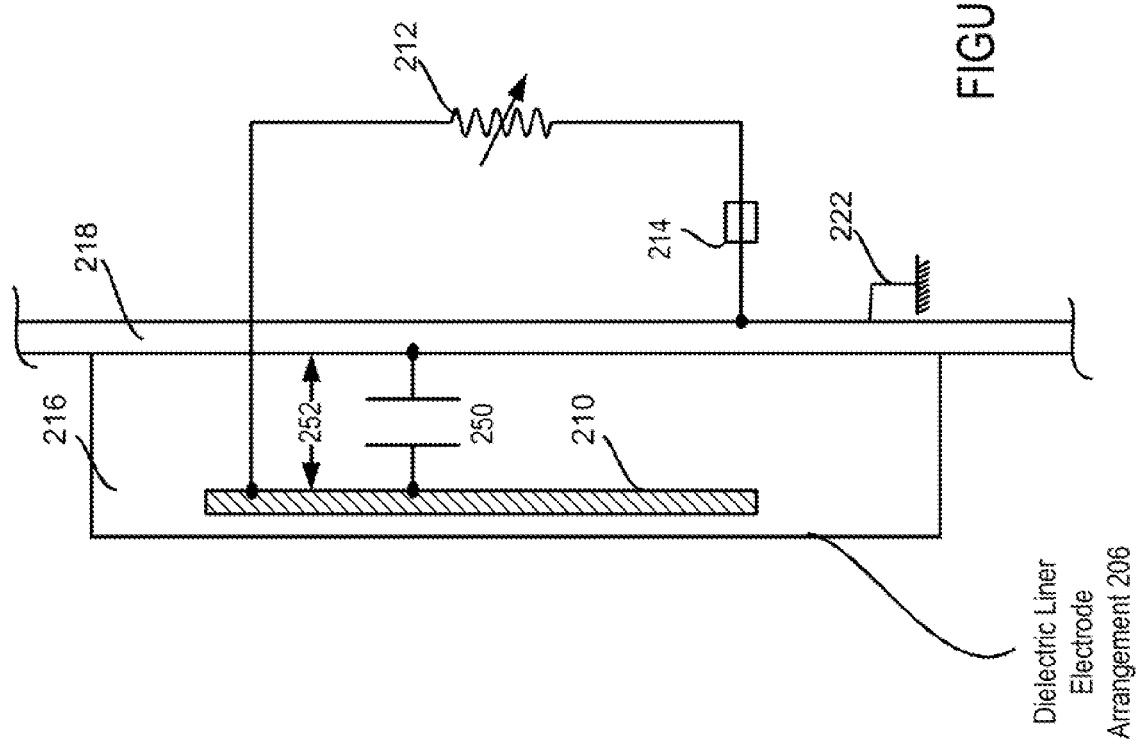
FIG. 2B shows, in an embodiment, a schematic of a dielectric liner electrode arrangement coupled to a set of inductive coils.

To increase the impedance, an inductive circuitry may be implemented between cylindrical electrode 210 and modified reactor wall 218. As shown in FIG. 2B an inductive circuitry 212 is in parallel with a capacitance 250 between cylindrical electrode 210 and reactor wall 218. The resulting electrical circuit is equivalent to a parallel LC circuit. The RF impedance curve of such circuit may vary with the RF frequency as shown on FIG. 4. In an embodiment, inductive circuitry 212 may include a set of inductor coils, which may be electrically connected to cylindrical electrode 210 via an electrical connection 208. In an embodiment, inductive circuitry 212 may be adjustable. The inductance of inductive circuitry 212 may be adjusted by adjusting the size of the coils, the number of coil turns, the coil material, the geometry of the coils, and the like. The impedance of the parallel LC circuit is also a function of both inductive circuitry 212 and capacitor 250. The impedance of the parallel LC circuit can therefore be changed by adjusting inductive circuitry 212.

In an embodiment, inductive circuitry 212 may be connected in series with an optional resistor 214. Inductive circuitry 212 and resistor 214 may be located outside the reactor. In an embodiment, resistor 214 may be employed to limit the abrupt change in impedance as a function of frequency. In an example, resistor 214 may broaden the resonance curve (see FIG. 4) such that a gradual change in the impedance may occur as frequency changes slightly. Thus, resistor 214 may provide the inductive circuitry with a more stable impedance value.

With the addition of the inductive circuitry, the impedance may be significantly increased and in turn may increase the voltage potential at cylindrical electrode 210. As a result, the electric field at the outer region (i.e., at the edge of plasma 202 and the confinement rings) may be significantly reduced. However, with an increase in voltage potential at cylindrical electrode 210, a second electric field may now be formed between cylindrical electrode 210 and reactor wall 216 and the second electric field may interact with the gas to ignite plasma.

To prevent plasma from forming between cylindrical electrode 210 and modified reactor wall 218, a dielectric liner 216 may be employed in an embodiment, cylindrical electrode 210 may be encapsulated within a dielectric liner 216, thereby preventing gas from flowing into the region between cylindrical electrode 210 and modified reactor wall 218 and interacting with the second electric field. Dielectric liner 216 may be made of dielectric material that may be compatible with the plasma process, in an embodiment. Examples of dielectric material include, but are not limited to, Kapton, quartz, polyetheretherketone (PEEK), Teflon, silicone, and plastics compatible with semiconductor processing conditions.

In an embodiment, to prevent plasma from forming at the edge of cylindrical electrode 210 (e.g., area 228 and area 230), the width of dielectric liner 216 may have to be wider than the width of cylindrical electrode 210. In other words, the top edge of dielectric liner 216 may extend beyond the top edge of cylindrical electrode 210 and the bottom edge of the dielectric liner 216 may extend beyond the bottom edge of the cylindrical electrode 210. Since the conductive cylindrical electrode 210 may be encapsulated within dielectric liner 216, conductive cylindrical electrode 210 may be prevented from interacting with the gas to ignite plasma within areas 228 and 230.

To better illustrate how the inventive reduced electric field arrangement may be implemented, FIG. 2B shows, in an embodiment, a schematic of a dielectric liner electrode arrangement coupled to a set of inductive coils. A capacitor 250 may be formed when dielectric liner electrode arrangement 206 (including cylindrical electrode 210 and dielectric liner 216) is attached to modified reactor wall 218, which may be grounded. The electrical coupling between modified reactor wall 218 and dielectric liner electrode arrangement 206 may result in relatively low impedance at cylindrical electrode 210. The induced voltage ($V_i$) at cylindrical electrode 210 may be relatively insignificant. In an embodiment, an external RF power may not have to be employed since the voltage potential may be generated from the same RF power that is applied to the electrostatic chuck during substrate processing. When inductive circuitry 212 is electrically connected to modified reactor wall 218, the voltage potential at cylindrical electrode 210 may increase. Concurrently, a second electrical field may be created in an area 252 (between cylindrical electrode 210 and modified reactor wall 218). To prevent plasma from being ignited in area 252, dielectric liner 216 may be added to prevent gas from flowing into area 252.

As shown in FIGS. 2A and 2B, the inventive reduced electric field arrangement may provide a simple and an inexpensive solution for reducing the electric field. By employing the same RF power that is applied to the electrostatic chuck during substrate processing, the modified reactor wall with the dielectric liner electrode arrangement may now have a voltage potential that may be utilized to decrease the electric field formed in the outer region. Thus, the potential for a plasma ignition in the outer region may be substantially reduced.

Figure 3A:
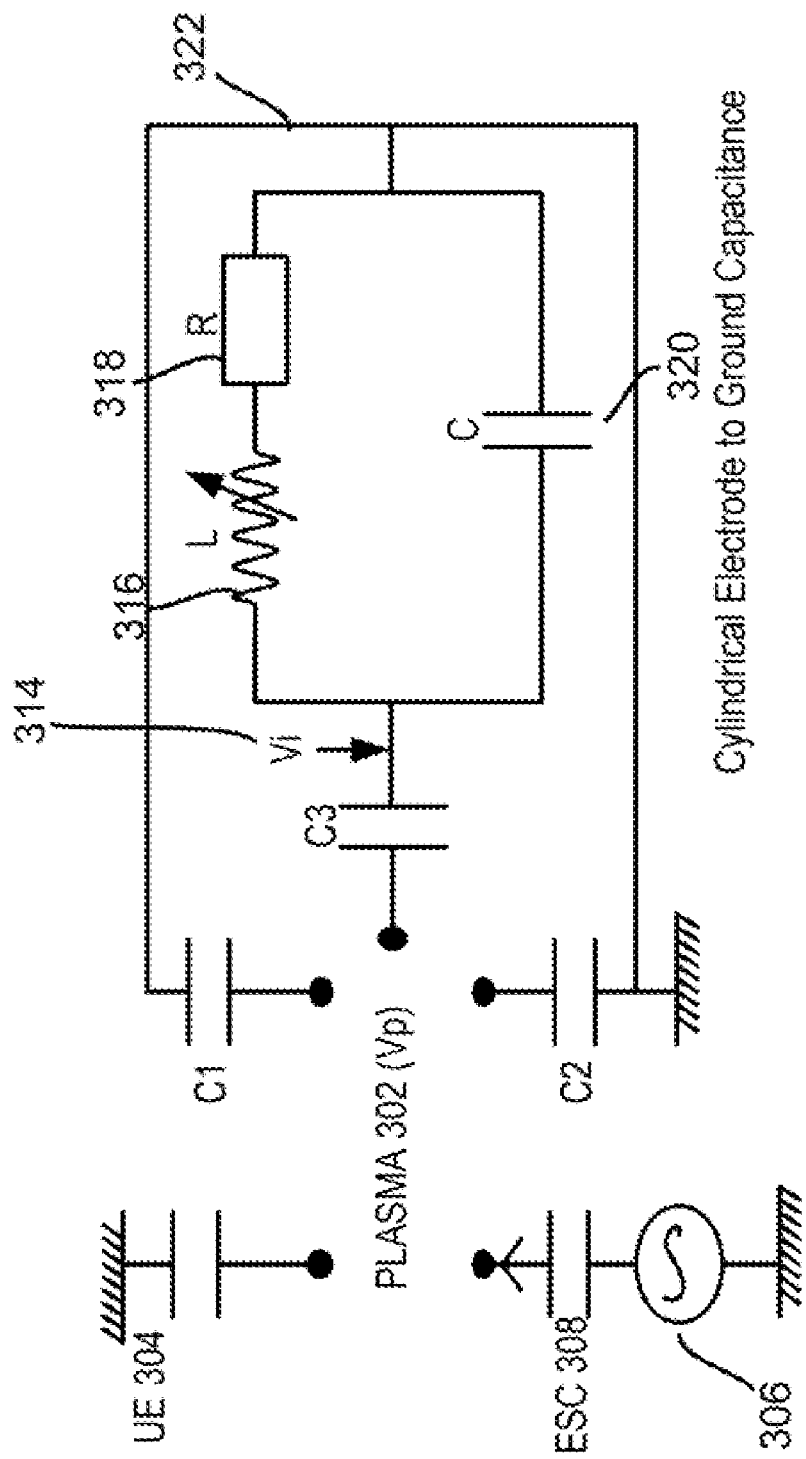
FIG. 3A shows a simplified schematic of a modified equivalent circuit model of the electrical plasma-to-ground coupling.

In an embodiment, the inductive circuitry may be implemented as a single or a series of inductance coils. FIG. 3A shows an example of a single inductive circuitry while FIG. 3B shows a variable inductive circuitry.

FIG. 3A shows a simplified schematic of a modified equivalent circuit model of the electrical plasma-to-ground coupling. During plasma processing, RF power 306 may be applied to an electrostatic chuck 308. Since upper electrode 304 is grounded, a large part of the RF current may return to ground through upper electrode 304. At the edge of the plasma, RF current may return to ground via three different paths. The RF current may return to ground (e.g., reactor walls) by capacitively coupling with an upper electrode extension and a lower electrode extension, which are shown as capacitors 21 and 22, respectively. The remaining RF current may return to ground by flowing through the confinement rings, as shown by capacitor 23.

In an embodiment, the modified equivalent circuit model may include a set of adjustable inductance coils 316 (L) and an optional resistor 318 (R), which may be in series with the confinement ring (shown as capacitor 23). In another embodiment, a reactor wall 322 may be modified by attaching a dielectric liner electrode arrangement. Thus, the modified equivalent circuit model may include a capacitor 2320, which is the capacitance that may occur between the dielectric liner electrode arrangement and reactor wall 322.

Figure 3B:
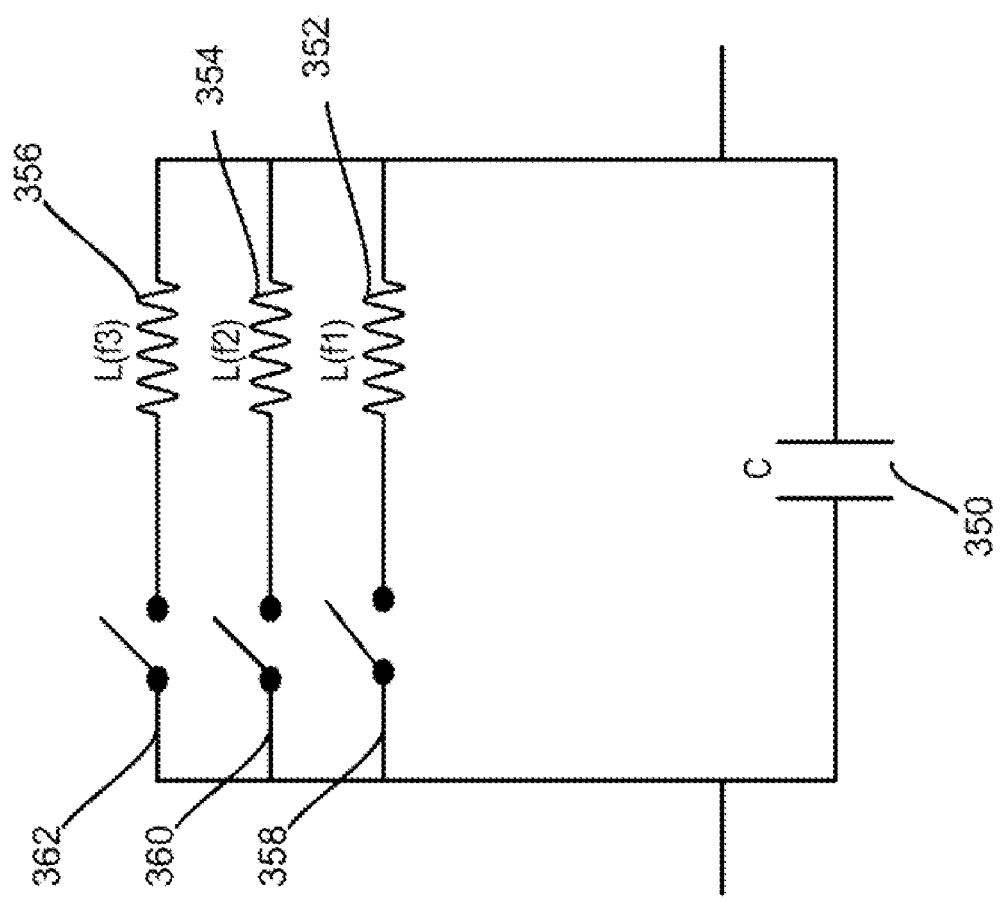
FIG. 3B shows, in an embodiment, a simplified schematic of a variable inductive circuitry.

FIG. 3B shows, in an embodiment, a simplified schematic of a variable inductive circuitry. Capacitor C 350 may represent the capacitance between the cylindrical electrode and the ground. In an embodiment, the variable inductive circuitry may be formed by having a plurality of inductor coils matched to a plurality of RF frequencies (e.g., f1, f2, f3, and the like) that may be the RF frequencies currently applied to the electrostatic chuck. For example, the inductor coil 352 may represent a first inductor coil matched to a first RF frequency (f1). The inductor coil 354 may represent a second inductor coil matched to a second RF frequency (f2). The inductor coil 356 represents a third inductor coil matched to a third RF frequency (f3). In an embodiment, switching between the plurality of inductor coils may be performed by manipulating one of a plurality of switches (358, 360, and 362). In an embodiment, the value of each inductance may be chosen such that the resonance frequency of each parallel LC circuit formed by an inductor coil and a capacitor is about equal to the RF frequency applied to an electrostatic chuck. In an example, the RF frequency of f1 is applied to an electrostatic chuck. The value of the inductance may be chosen such as the resonance frequency of the first parallel LC circuit formed by first inductor coil 352 and capacitor 350 is about equal to the value of f1.

In the prior art, manufacturers may increase RF power by employing a single, double or triple frequency RF power discharge. The increase in RF power may lead to higher electric field in the outer region which may cause plasma unconfinement. In an embodiment, an inductive circuitry may allow for the matching of impedance to a particular RF frequency being employed resulting in an induced voltage potential 314 being created at the cylindrical electrode of the dielectric liner electrode arrangement.

The value of the inductance (L) may be adjusted in order to maximize the impedance of the parallel LC circuit formed by the inductive circuitry in parallel with the cylindrical electrode to ground capacitance (C). The value of inductance (L) may be calculated by employing Equation 2.

$$L = \frac{1}{4\pi^2 f^2 C}, \quad \text{Equation 2}$$

According to Equation 2, the inductance (L) may be a function of the cylindrical electrode to ground capacitance and a function of the resonance frequency. Given that the resonance frequency may be equaled to one the RF frequencies applied to the electrostatic chuck, the resonance frequency is a known value. Also, the cylindrical electrode to ground capacitance (C) may be a fixed value and represent the capacitance between the cylindrical electrode and the reactor wall.

$$E \approx \frac{V_p - V_i}{d} \quad \text{Equation 3}$$

By adjusting the inductance (L), the voltage potential ($V_i$) at the cylindrical electrode may be substantially increased relative to the voltage potential ($V_p$) of the plasma. As shown in Equation 3, increasing voltage potential ($V_i$) relative to voltage potential ($V_p$) may result in a decrease in a voltage potential difference. As a result, the electric field in the confinement ring region may be reduced. Thus, the possibility of a plasma being ignited in the outer region is significantly reduced and the plasma may be confined within the wafer region.

Figure 4:
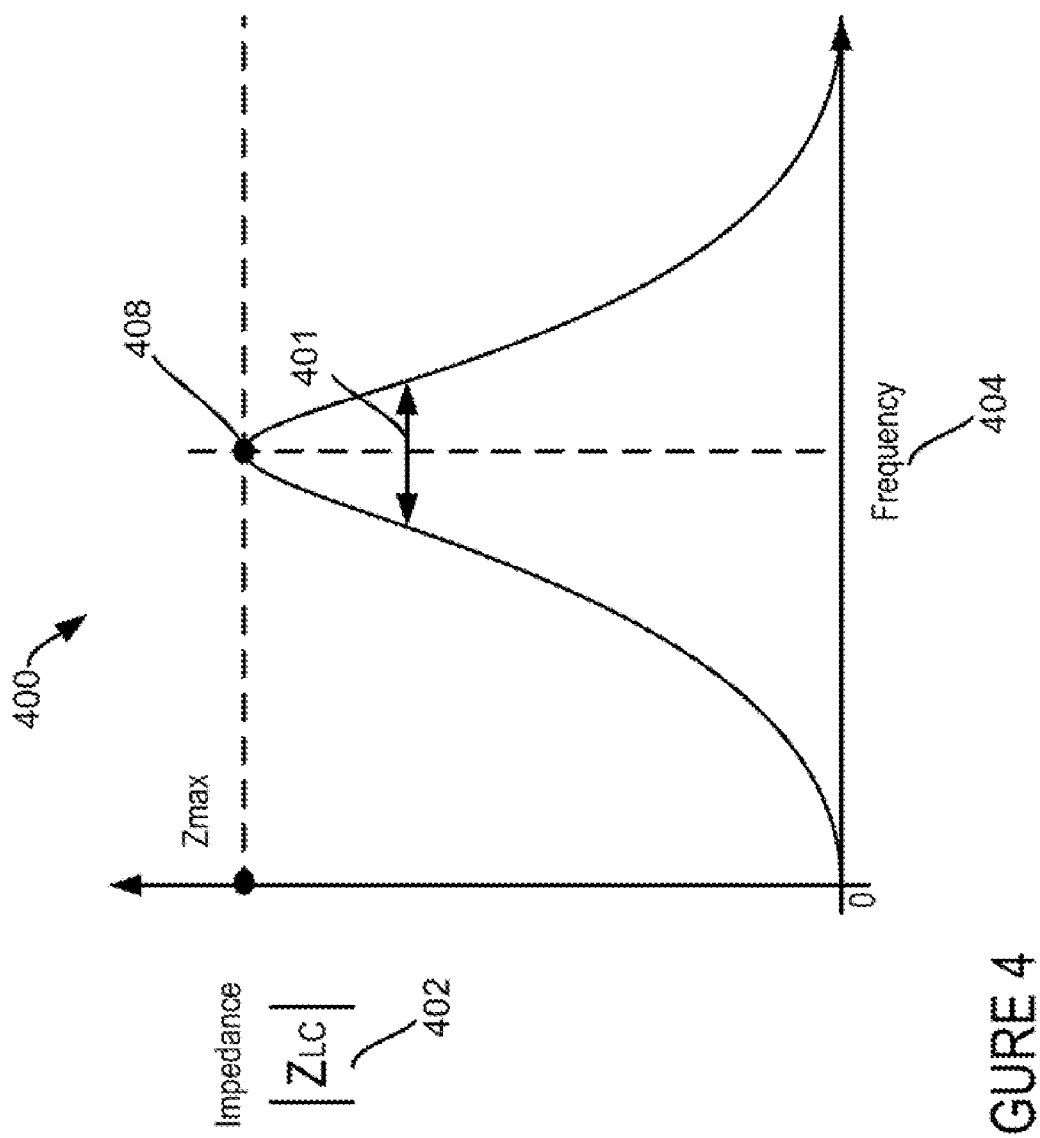
FIG. 4 shows, in an embodiment of the present invention, a resonance curve of a parallel LC circuit.

FIG. 4 shows, in an embodiment of the present invention, a resonance curve of a parallel LC circuit 400. The resonance curve of parallel LC circuit 400 represents a graphical relationship between an impedance $Z_{LC}$ 402 and a frequency 404. In other words, impedance $Z_{LC}$ 402 is a function of frequency 404. To determine the inductance (L) value, the value at which the impedance $Z_{LC}$ is highest (e.g., a point 408) may be chosen, in an embodiment. The highest impedance may be chosen in order to increase the voltage potential at the cylindrical electrode. By applying Equation 2, the inductance (L) that may best match the current RF frequency may be calculated. Once the inductance (L) value has been determined, the type of inductance coil that may be employed may be determined. In an example, the inductance (L) value may determine the size of the coil, the number of coil turns, the material of the coil, the geometry of the coil, and the like.

In an embodiment, a width 401 of the resonance curve may be widened and the sharpness of the resonance curve may be soften by adding a resistor in the parallel LC circuit. In an example, the resonance curve may reflect a more gradual impedance change as a function of frequency. Although the highest impedance generated by a parallel LC circuit with one or more resistors may be less than a parallel circuit without a resistor, the resistor may actually provide a more stable impedance value for the inductive circuitry around the resonance frequency.

As may be appreciated from the foregoing, embodiments of the invention enable manufacturers to increase the process window because the electric field may be substantially decreased, thereby, reducing the risk of plasma being created in the outer region. By controlling the electric field, the RF power and/or gas flow rate may be increased to enhance the plasma density without causing unconfinement of the plasma. Advantageously, the reduced electric field arrangement is a cost effective solution since the materials are readily available and fairly inexpensive. Also, the reduced electric field arrangement may be implemented without increasing the size of the plasma tool. Instead, the reduced electric field arrangement may be provided as a kit that may be compatible with current plasma tools, thus, enabling the owners of the tools to retrofit theirs plasma tools without substantially increasing ownership cost.

While this invention has been described in terms of several preferred embodiments, there are alterations, permutations, and equivalents, which fall within the scope of this invention. Also, the title, summary, and abstract are provided herein for convenience and should not be used to construe the scope of the claims herein. It should also be noted that there are many alternative ways of implementing the methods and apparatuses of the present invention. In an example, the dielectric liner may not have to be attached to the reactor wall as described in one or more embodiments described above. Instead, spacing may exist between the dielectric liner and the reactor wall (e.g., chamber wall) if the spacing is configured in such a manner that plasma is not able to be generated in the space between the dielectric liner and the reactor wall. Further, the dielectric liner may be formed of multi-parts, which may be comprised of different materials. Although various examples are provided herein, it is intended that these examples be illustrative and not limiting with respect to the invention. Further, in this application, a set of "n" items refers zero or more items in the set. It is therefore intended that the following appended claims be interpreted as including all such alterations, permutations, and equivalents as fall within the true spirit and scope of the present invention.

What is claimed is:

1. A method for confining plasma within a plasma processing chamber while processing a substrate, comprising:
   igniting said plasma within a plasma generating area, wherein said plasma generating area is surrounded by a set of confinement rings;
   providing a chamber wall outside of said set of confinement rings;
   providing a dielectric liner electrode arrangement positioned between said chamber wall and said set of confinement rings, wherein said dielectric liner electrode arrangement having an electrode encapsulated within a dielectric liner, said dielectric liner electrode arrangement being coupled with said chamber wall to create a modified chamber wall; and
   providing a parallel LC circuit arrangement, said parallel LC circuit arrangement being coupled between said dielectric liner electrode arrangement and said chamber wall.

2. The method of claim 1 wherein said electrode is cylindrical.

3. The method of claim 1 wherein said dielectric liner electrode arrangement is coupled to said chamber wall via a set of dielectric fixtures.

4. The method of claim 1 wherein said electrode is made from a conductive material.

5. The method of claim 1 wherein said dielectric liner has a larger width than said electrode.

6. The method of claim 1 wherein said parallel LC circuit arrangement includes an inductive circuit in parallel with a capacitor.

7. The method of claim 6 wherein said inductive circuit is a set of inductor coils.

8. The method of claim 6 wherein said inductive circuit is connected in series with a resistor.

9. The method of claim 6 wherein said inductive circuit is connected to said electrode via an electrical connection.

10. The method of claim 9 wherein said inductive circuit is adjustable by adjusting at least one of the size of the coils, the number of coil turns, the material of said coils, and the geometry of said coils.

11. An arrangement for confining plasma in a plasma processing chamber, comprising:
    a set of confinement rings, wherein said plasma is formed within an area surrounded by said set of confinement rings;
    a chamber wall outside of said set of confinement rings;
    a dielectric liner electrode arrangement positioned between said chamber wall and said set of confinement rings, wherein said dielectric liner electrode arrangement having an electrode encapsulated within a dielectric liner, said dielectric liner electrode arrangement being coupled with said chamber wall to create a modified chamber wall; and
    a parallel LC circuit arrangement, said parallel LC circuit arrangement being coupled between said dielectric liner electrode arrangement and said chamber wall; and
    a lower electrode coupled to an RF power source configured to generate said plasma.

12. The arrangement of claim 11 wherein said electrode is cylindrical.

13. The arrangement of claim 11 wherein said dielectric liner electrode arrangement is coupled to said chamber wall via a set of dielectric fixtures.

14. The arrangement of claim 11 wherein said electrode is made from a conductive material.

15. The arrangement of claim 11 wherein said dielectric liner has a larger width than said electrode.

16. The arrangement of claim 11 wherein said parallel LC circuit arrangement includes an inductive circuit in parallel with a capacitor.

17. The arrangement of claim 16 wherein said inductive circuit is a set of inductor coils.

18. The arrangement of claim 16 wherein said inductive circuit is connected in series with a resistor.

19. The arrangement of claim 16 wherein said inductive circuit is connected to said electrode via an electrical connection.

20. The arrangement of claim 19 wherein said inductive circuit is adjustable by adjusting at least one of the size of the coils, the number of coil turns, the material of said coils, and the geometry of said coils.

* * * * *